(12) United States Patent
Kim et al.

(10) Patent No.: US 12,489,454 B2
(45) Date of Patent: Dec. 2, 2025

(54) SUPPORTING CIRCUITS WITH A SINGLE LOCAL OSCILLATOR

(71) Applicant: SAMSUNG ELECTRONICS CO., LTD., Suwon-si (KR)

(72) Inventors: Joo-Han Kim, Suwon-si (KR); Jungsu Han, Suwon-si (KR); Beom Kon Kim, Suwon-si (KR); Joohyun Do, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 226 days.

(21) Appl. No.: 18/348,972

(22) Filed: Jul. 7, 2023

(65) Prior Publication Data

US 2024/0137032 A1 Apr. 25, 2024
US 2024/0235566 A9 Jul. 11, 2024

(30) Foreign Application Priority Data

Oct. 20, 2022 (KR) .................. KR10-2022-0135783

(51) Int. Cl.
*H03M 1/10* (2006.01)
*H03M 1/06* (2006.01)
*H03M 1/12* (2006.01)

(52) U.S. Cl.
CPC ....... *H03M 1/0607* (2013.01); *H03M 1/0626* (2013.01); *H03M 1/125* (2013.01)

(58) Field of Classification Search
CPC .......... H03M 3/424; H03M 3/43; H03M 3/45; H03M 3/452; H03M 3/496; H03M 1/12; H03M 3/36; H03M 3/402; H03M 3/42; H03M 3/454; H03M 3/468; H03M 3/486; H03M 3/49; H03G 3/3068; H03G 3/3078; H04B 1/0007; H04B 1/0039;
(Continued)

(56) References Cited

U.S. PATENT DOCUMENTS 5,872,540 A * 2/1999 Casabona ............... G01S 1/045
455/283
6,061,385 A * 5/2000 Ostman .................. H04B 1/406
375/316
(Continued)

FOREIGN PATENT DOCUMENTS

KR 10-1643239 7/2016

*Primary Examiner* — Linh V Nguyen
(74) *Attorney, Agent, or Firm* — MORGAN, LEWIS & BOCKIUS LLP

(57) ABSTRACT

A digital signal processing circuit includes an analog gain compensator that compensates for an analog gain of a baseband signal including a plurality of component carriers (CCs) to output a compensated baseband signal; an analog-to-digital converter (ADC) that converts the compensated baseband signal into a first digital signal; a plurality of filtering circuits that generate a second digital signal from the first digital signal; and a control circuit. Each filtering circuit sequentially filters the first digital signal so that a corresponding one of the second digital signals retains one CC among the CCs, compensates for a digital gain, and a performs down-sampling. The control circuit generates an analog gain control signal for controlling the analog gain based on the second digital signals and a digital gain control signal for controlling the digital gain.

19 Claims, 6 Drawing Sheets

(58) Field of Classification Search
CPC .. H04B 1/0483; H04B 1/707; H04B 10/2575; H04B 10/25753
USPC .................................................. 341/118–121
See application file for complete search history.

(56) References Cited

U.S. PATENT DOCUMENTS

| | | | | |
|---|---|---|---|---|
| 6,343,207 | B1* | 1/2002 | Hessel | H04B 1/0003 |
| | | | | 455/84 |
| 7,116,955 | B2* | 10/2006 | Schaffer | H03G 3/3068 |
| | | | | 375/345 |
| 7,236,117 | B1* | 6/2007 | Varma | H03M 1/1028 |
| | | | | 341/122 |
| 8,295,371 | B2 | 10/2012 | Rick et al. | |
| 8,391,384 | B2* | 3/2013 | Lai | H03G 3/3068 |
| | | | | 375/345 |
| 8,477,887 | B2* | 7/2013 | Challa | H03G 3/3078 |
| | | | | 375/345 |
| 9,450,598 | B2* | 9/2016 | Taratorin | G01S 7/021 |
| 9,716,933 | B2 | 7/2017 | Oliaei | |
| 10,581,406 | B2 | 3/2020 | Tangudu et al. | |
| 11,545,995 | B1* | 1/2023 | Janesch | H03M 1/0626 |
| 2008/0013654 | A1* | 1/2008 | Rick | H04L 25/06 |
| | | | | 375/345 |
| 2010/0248665 | A1* | 9/2010 | Jonsson | H03G 3/3068 |
| | | | | 455/140 |
| 2011/0070858 | A1* | 3/2011 | He | H04B 1/28 |
| | | | | 455/302 |
| 2012/0163434 | A1 | 6/2012 | Kim et al. | |
| 2014/0098913 | A1* | 4/2014 | Fernandes Barros | H04L 27/3863 |
| | | | | 375/346 |
| 2020/0412399 | A1* | 12/2020 | Asada | H03D 1/00 |
| 2021/0273646 | A1* | 9/2021 | Howlett | H03M 1/188 |

* cited by examiner

SUPPORTING CIRCUITS WITH A SINGLE LOCAL OSCILLATOR

CROSS-REFERENCE TO RELATED APPLICATIONS

This U.S. non-provisional patent application claims priority under 35 U.S.C. § 119 to Korean Patent Application No. 10-2022-0135783 filed on Oct. 20, 2022, in the Korean Intellectual Property Office, the disclosure of which is incorporated by reference in its entirety herein.

1. Technical Field

Embodiments of the present disclosure described herein relate to support of circuits with a single local oscillator (LO), and more particularly to a digital signal processing circuit, a digital filter, and a receiver including the digital signal processing circuit.

2. Discussion of Related Art

An LO is an electronic oscillator that may be used with a mixer to change the frequency of a signal. The process used to change the frequency may be referred to as heterodyning.

When a plurality of circuits (e.g., cells) share one local oscillator (LO), received signal strengths between cells may be different. An existing receiver supporting one LO operates to compensate the analog gain of a baseband signal for multiple cells through a common analog gain, convert the baseband signal into a digital signal, and compensate the digital gain after decimating the digital signal at a Nyquist frequency.

In this case, when a common analog gain is set to a cell having relatively strong signal strength, a relatively weak cell signal exhibits a low signal-to-quantization noise ratio (SQNR). On the contrary, when a common analog gain is set to a cell having a relatively weak signal strength, power saturation may occur in a relatively strong cell signal. This may cause a greater effect on the receiver when the bandwidth is wide like in millimeter wave (mmWave), or when the number of cells sharing a single LO increases.

SUMMARY

Embodiments of the present disclosure provide a digital signal processing circuit capable of supporting multiple cells with one LO, a digital filter and a receiver including the digital signal processing circuit.

According to an embodiment, a digital signal processing circuit includes an analog gain compensator configured to compensate for an analog gain of a baseband signal including a plurality of component carriers (CCs) to output a compensated baseband signal; an analog-to-digital converter (ADC) configured to convert the compensated baseband signal into a first digital signal; a plurality of filtering circuits configured to generate second digital signals from the first digital signal; and a first control circuit. Each filtering circuit sequentially filters the first digital signal so that a corresponding one of the second digital signals retains one CC among the CCs, compensates for a digital gain, and a performs down-sampling. The first control circuit is configured to generate an analog gain control signal for controlling the analog gain based on the second digital signals and a digital gain control signal for controlling the digital gain based on the second digital signals.

For example, each of the plurality of filtering circuits may include a mixer configured to output a frequency-shifted digital signal from the first digital signal by shifting the one CC to a target frequency; a filter configured to output a filtered digital signal from which CCs other than the one CC are removed from the frequency-shifted digital signal by filtering the frequency-shifted digital signal based on the target frequency; a digital gain compensator configured to output a compensated digital signal by compensating for a digital gain of the filtered digital signal based on the digital gain control signal; and a decimation filter configured to output a corresponding one of the second digital signals by filtering and down-sampling the compensated digital signal corresponding to a system bandwidth of the one CC.

For example, the target frequency may include a DC frequency.

For example, the mixer may shift the one CC to the target frequency using a frequency corresponding to the one CC generated by local oscillator (LO).

For example, the one CC may be different for each of the plurality of filtering circuits.

For example, the digital gain control signal may be generated for each of the plurality of filtering circuits.

For example, the digital gain control signal may control each of the plurality of filtering circuits to allow a digital gain of the one CC to be compensated with a target digital gain.

For example, the first control circuit may include a plurality of logic circuits connected to each of the plurality of filtering circuits and configured to perform a Fourier transform on a corresponding one of the second digital signals to output Fourier transformed digital signals; a plurality of power measurement circuit configured to measure a power value from each of the Fourier-transformed digital signals; and a second control circuit configured to generate the analog gain control signal and the digital gain control signal based on the power values.

For example, the filter may include a low-pass-filter (LPF).

For example, a signal-to-quantization noise ratio (SQNR) of at least one of the second digital signal may be greater than a SQNR of the compensated digital signal.

For example, the second digital signals may be generated to satisfy a target power for each of the plurality of CCs.

According to an embodiment, a digital filter includes a plurality of filtering circuits each configured to process one CC of a plurality of CCs, wherein each of the plurality of filtering circuits includes a mixer configured to output a frequency-shifted digital signal by shifting one CC among the plurality of CCs from a first digital signal converted from a baseband signal to a target frequency; a filter configured to output a filtered digital signal from which CCs other than the one CC are removed from the frequency-shifted digital signal by filtering the frequency-shifted digital signal based on the target frequency; a digital gain compensator configured to output a compensated digital signal by compensating for a digital gain of the filtered digital signal; and a decimation filter configured to output a second digital signal by filtering and down-sampling the compensated digital signal corresponding to a system bandwidth of the one CC.

For example, the digital gain control signal may be different for each of the plurality of filtering circuits.

For example, the target frequency may include a DC frequency.

For example, the mixer may shift the one CC to the target frequency using a frequency corresponding to the one CC generated by a local oscillator (LO).

For example, the digital gain compensator may operate based on a digital gain control signal generated for each of the plurality of filtering circuits.

For example, a signal-to-quantization noise ratio (SQNR) of the second digital signal may be greater than a SQNR of the compensated digital signal.

For example, the second digital signal may be generated to satisfy a target power for each of the plurality of CCs.

According to an embodiment, a receiver includes a low-noise amplifier (LNA) configured to amplify an RF signal including a plurality of component carriers (CCs) received from an antenna; a receiving circuit configured to process the RF signal using an oscillator signal generated by a single local oscillator (LO) to output a baseband signal; and a digital signal processing circuit configured to digitally process the baseband signal. The digital signal processing circuit includes an analog gain compensator configured to compensate for an analog gain of a baseband signal to output a compensated baseband signal; an analog-to-digital converter (ADC) configured to convert the compensated baseband signal into a first digital signal; a plurality of filtering circuits configured to generate a second digital signal from the first digital signal; and a control circuit. Each filtering circuit sequentially filters the first digital signal so that a corresponding one of the second digital signals retains one CC among the CCs, compensates for a digital gain, and performs down-sampling. The control circuit is configured to generate an analog gain control signal for controlling the analog gain based on the second digital signals and a digital gain control signal for controlling the digital gain based on the plurality of second digital signals.

For example, the digital filter may include a plurality of filtering circuits each configured to process one CC of the plurality of CCs.

According to an embodiment, a digital signal processing circuit and a receiver including the same are disclosed with increased SQNR performance without signal saturation even in a structure supporting multiple cells with a single LO.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
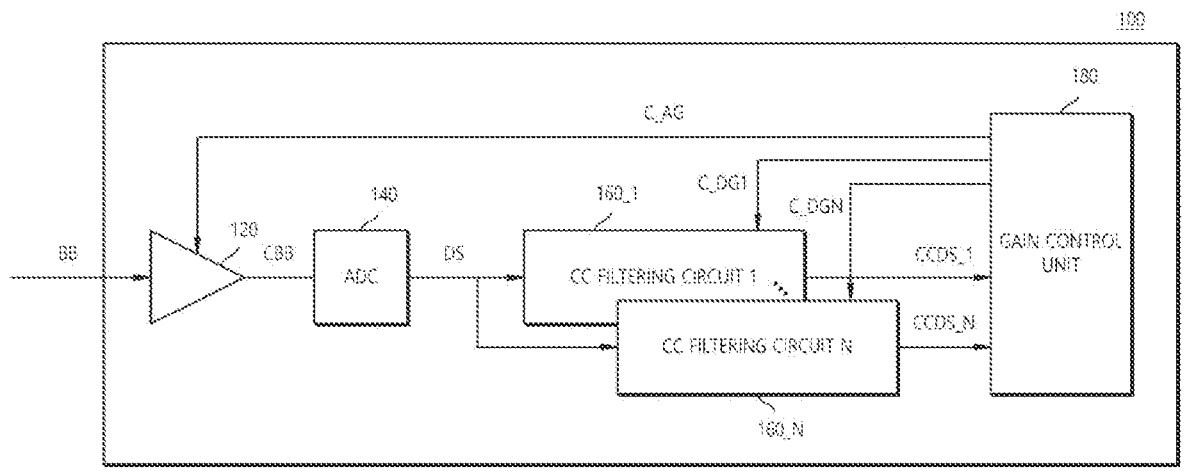
FIG. 1 is a diagram illustrating a digital signal processing circuit according to an embodiment of the present disclosure.

Hereinafter, embodiments of the present disclosure will be described clearly and in detail so that those skilled in the art can easily carry out embodiments of the present disclosure. FIG. 1 is a diagram illustrating a digital signal processing circuit according to an embodiment of the present disclosure.

Referring to FIG. 1, a digital signal processing circuit 100 according to an embodiment is configured to digitally process a received baseband signal BB. In the present disclosure, unless otherwise specified, the baseband signal BB may be a radio frequency (RF) signal received from a plurality of cells (e.g., circuits) and converted into a baseband signal through a single LO. The RF signal received from a plurality of cells includes a frequency block, that is a cell signal, transmitted through a plurality of component carriers (CCs) corresponding to each cell, and is converted from an RF band to a baseband through a single LO. Therefore, the baseband signal BB also includes a plurality of frequency blocks like the RF signal. Because each cell transmits an RF signal through a different CC, signals transmitted from different cells are distinguished based on the CC in the present disclosure.

As described above, the digital signal processing circuit 100 according to an embodiment includes an analog gain compensator 120 (e.g., analog gain compensator circuit), an analog-to-digital converter (ADC) 140 (e.g., an ADC circuit), a plurality of CC filtering circuits 160_1 to 160_N, and a gain controller 180 (e.g., a control circuit) to digitally process the baseband signal BB including a plurality of CCs.

The analog gain compensator 120 compensates for the analog gain of the baseband signal BB for the plurality of CCs to output a compensated baseband signal CBB. The analog gain compensator 120 may receive an analog gain control signal C_AG from the gain controller 180 and compensate for the analog gain of the baseband signal BB based on the received analog gain control signal C_AG.

The analog gain control signal C_AG may indicate the analog gain to be compensated for according to power measured from the baseband signal BB. Accordingly, the analog gain may be a variable gain, and the analog gain compensator 120 may be implemented with a variable-gain amplifier (VGA). For example, as shown, the analog gain compensator 120 may amplify the power of the baseband signal BB to compensate for the analog gain indicated by the analog gain control signal C_AG.

The ADC 140 converts the analog gain-compensated baseband signal CBB through the analog gain compensator 120 into a digital signal. For convenience, the digital signal converted through the ADC 140 may be referred to as a first digital signal DS. The ADC 140 may operate with an ADC range, which is a certain input range for the magnitude of an input signal, that is, a compensated baseband signal (CBB), according to hardware characteristics. The ADC range may have a maximum value ADC max and a minimum value ADC min. A signal that exceeds the maximum value ADC max in the ADC range will reach saturation.

The plurality of CC filtering circuits 160_1 to 160_N are configured to generate second digital signals CCDS_1 to CCDS_N filtered for the plurality of CCs based on the first digital signal DS converted through the ADC 140, respectively. In this case, the second digital signals CCDS_1 to CCDS_N refer to digital signals, each of which is obtained by separating one CC from among the plurality of CCs included in the first digital signal DS.

According to an embodiment, each of the plurality of CC filtering circuits 160_1 to 160_N generates the second digital signals CCDS_1 to CCDS_N through digital filter operations of sequentially performing removing of the remaining CCs except for one CC among the plurality of CCs for the first digital signal DS, compensating for the digital gain, and performing a decimation. In this case, the decimation may include at least one of a filtering operation and a down-sampling operation for the digital gain-compensated signal.

One CC corresponding to each of the second digital signals CCDS_1 to CCDS_N is different for each of the plurality of CC filtering circuits 160_1 to 160_N. That is, the plurality of CC filtering circuits 160_1 to 160_N may be configured to generate the second digital signals CCDS_1 to CCDS_N corresponding to one different CC among the plurality of CCs, respectively.

The plurality of CC filtering circuits 160_1 to 160_N according to an embodiment first perform an operation of removing the remaining CCs from the first digital signal DS except for one CC, and sequentially perform digital gain compensation and decimation for the filtered digital signal for each CC. That is, because digital gain compensation is performed after separation for each CC, the second digital signals CCDS_1 to CCDS_N may be generated to satisfy a target power for each of a plurality of CCs.

In addition, because the decimation is performed after compensation of the digital gain, a signal-to-quantization-noise ratio (SQNR) of the second digital signals CCDS_1 to CCDS_N may be greater than that of the digital signal for which the digital gain is compensated. The quantization level or quantization noise of SQNR has a small variability when the signal strength is small. Therefore, when decimation is performed in a state where the digital gain is not compensated, the SQNR of a digital signal for a CC of a cell having a weak signal strength is low, resulting in low signal quality. On the contrary, in the present disclosure, as described above, because a signal of a weak cell may have sufficiently increased strength through digital gain compensation, the quantization level may be increased or quantization noise may be reduced through decimation, and thus the SQNR may be increased. Hereinafter, operations related to SQNR will be described based on quantization noise unless otherwise specified.

The gain controller 180 generates the analog gain control signal C_AG for controlling an analog gain based on the second digital signals CCDS_1 to CCDS_N, and digital gain control signals C_DG1 to C_DGN for controlling a digital gain. In detail, the gain controller 180 may receive the second digital signals CCDS_1 to CCDS_N generated from each of the plurality of CC filtering circuits 160_1 to 160_N, measure a power value from the second digital signals CCDS_1 to CCDS_N, and generate the analog gain control signal C_AG and the digital gain control signals C_DG1 to C_DGN based on the measured power value.

The analog gain control signal C_AG is a signal for compensating for the baseband signal BB before being converted into a digital signal with a common analog gain regardless of the plurality of CCs. On the contrary, the digital gain control signals C_DG1 to C_DGN are signals that are generated for the plurality of CC filtering circuits 160_1 to 160_N, and control the plurality of CC filtering circuits 160_1 to 160_N to compensate for the digital gain of one CC with a target digital gain, respectively. Accordingly, each of the plurality of CC filtering circuits 160_1 to 160_N may receive different digital gain control signals C_DG1 to C_DGN from the gain controller 180, and compensate for the first digital signal DS according to each indicating digital gain.

According to the above-described embodiments, when a plurality of cell signals are received through one LO, the digital signals are separated for each of a plurality of CCs, and the digital gain compensation operation and decimation for each separated digital signal are sequentially performed. That is, because the digital gain compensation operation is performed differently for each separated digital signal, saturation may be prevented even for a signal to which a common analog gain is applied. In addition, according to an embodiment of the present disclosure, because decimation is performed after compensating for the digital gain in consideration of the feature of the SQNR as described above, a digital signal having a higher quality SQNR may be obtained. Therefore, it is possible to apply at least one embodiment of the present disclosure to a receiver structure supporting multiple cells with a single LO without performance degradation of multiple cells.

Figure 2:
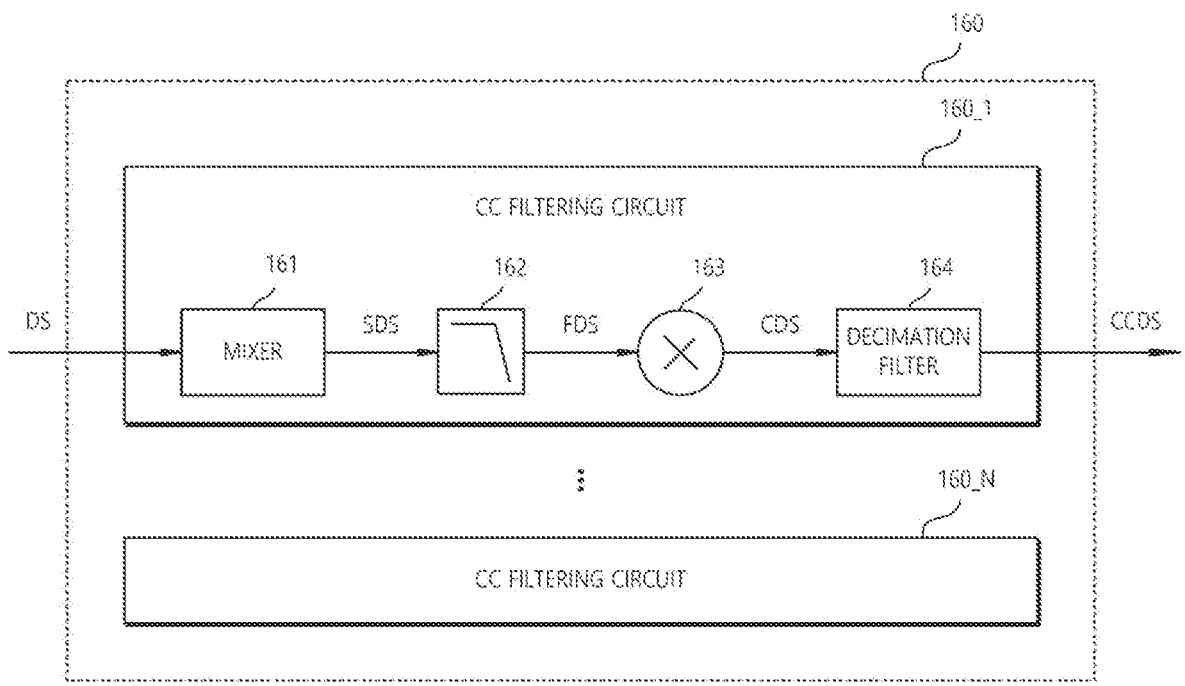
FIG. 2 a diagram illustrating a digital filter according to an embodiment of the present disclosure.

FIG. 2 a diagram illustrating a digital filter according to an embodiment of the present disclosure.

Referring to FIG. 2, a digital filter according to an embodiment includes the plurality of CC filtering circuits 160_1 to 160_N each of which is configured to process one CC among a plurality of CCs. Each of the plurality of CC filtering circuits 160_1 to 160_N includes a mixer 161 (e.g., a mixer circuit), a filter 162 (e.g., a filter circuit), a digital gain compensator 163 (e.g., a digital gain compensator circuit), and a decimation filter 164 (e.g., a filter circuit). All of the plurality of CC filtering circuits 160_1 to 160_N may include the same components, and for convenience, only one CC filtering circuit 160_1 is shown in FIG. 2.

The mixer 161 shifts one CC to a target frequency to output a frequency-shifted digital signal SDS from the first digital signal DS. For example, the mixer 161 may shift one CC to a target frequency through an LO frequency corresponding to one CC. For example, the target frequency may be a direct current (DC) frequency.

The mixer 161 is provided to each of the plurality of CC filtering circuits 160_1 to 160_N, so that a plurality of mixers may be included in a digital filter 160, and the plurality of mixers may operate differently from each other. For example, in the case of a mixer processing a CC corresponding to a frequency higher than the target frequency, the frequency of the CC may be shifted to the target frequency by down-converting the frequency. For example, in the case of a mixer processing a CC corresponding to a frequency lower than the target frequency, the frequency of the CC may be shifted to the target frequency by up-converting the frequency.

The digital signal SDS frequency-shifted through the mixer 161 may be frequency-shifted to a common target frequency with the power of each CC.

The filter 162 performs filtering of the digital signal SDS frequency-shifted through the mixer 161. In detail, the filter 162 outputs a digital signal FDS obtained by filtering CCs from the frequency-shifted digital signal SDS except for one CC based on the target frequency. In this case, the one CC is a CC to be processed by the plurality of CC filtering circuits 160_1 to 160_N including the filter 162.

Because the filter 162 is provided to each of the plurality of CC filtering circuits 160_1 to 160_N, a plurality of filters may be included in the digital filter 160, each of which filters only one CC therethrough by appropriately setting a cut-off frequency. Although FIG. 2 shows that the filter 162 is a low pass filter (LPF), embodiments of the disclosure are not limited thereto and various types of filters capable of filtering only one CC may be employed.

The digital gain compensator 163 compensates for the digital gain of the digital signal FDS filtered by the filter 162 and outputs a compensated digital signal CDS. Specifically, the digital gain compensator 163 receives a digital gain control signal (e.g., C_DG1) from the gain controller 180 and compensates for a digital gain based on the received digital gain control signal.

As the digital gain compensator 163 is provided for each of the plurality of CC filtering circuits 160_1 to 160_N, a plurality of digital gain compensators may be included in the digital filter 160, and each of the plurality of digital gain compensators may operation according to a different digital gain control signal. Accordingly, the digital gain compensator 163 may compensate for the digital signals FDS filtered differently for each of the plurality of CC filtering circuits 160_1 to 160_N with an appropriate digital gain.

The decimation filter 164 performs decimation (i.e., filtering and down-sampling) by matching the digital signal CDS compensated through the digital gain compensator 163 according to the system bandwidth of one cell, that is, one CC, thereby outputting the second digital signal CCDS. Because the digital signal DS converted through the ADC 140 is generally output at a sampling frequency (Nyquist frequency) higher than the system bandwidth, the digital signal is down-sampled corresponding to the system bandwidth through the decimation filter 164.

As the decimation filter 164 is provided for each of the plurality of CC filtering circuits 160_1 to 160_N, a plurality of decimation filters may be included in the digital filter 160. Through each of the plurality of decimation filters, a plurality of second digital signals CCDS finally filtered for each CC are output.

According to the above-described embodiment, the digital filter 160 sequentially includes the mixer 161, the filter 162, the digital gain compensator 163, and the decimation filter 164, and sequentially performs the filtering, digital gain compensation, and decimation for each CC. Accordingly, the digital gain for each CC may be compensated for without power saturation. In addition, because the decimation is performed with sufficient strength through digital gain compensation, the quantization noise of a digital signal may be increased, thereby improving the SQNR.

Figure 3:
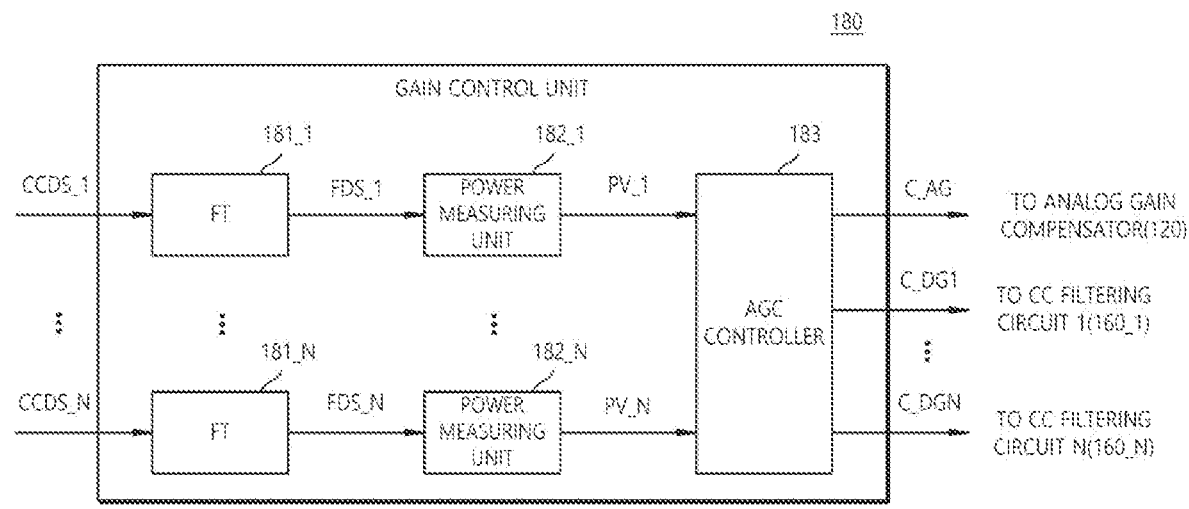
FIG. 3 is a diagram illustrating a gain controller according to an embodiment of the present disclosure.

FIG. 3 is a diagram illustrating a gain controller according to an embodiment of the present disclosure.

Referring to FIG. 3, a gain controller according to an embodiment is configured to automatically adjust the gain of the second digital signals CCDS_1 to CCDS_N output through the digital filter 160, and includes Fourier transformers 181_1 to 181_N (e.g., logic circuits), power measurement units 182_1 to 182_N (e.g., measurement circuits), and an automatic gain control (AGC) controller 183 (e.g., a control circuit).

The Fourier transformers 181_1 to 181_N may be provided for a plurality of CCs, respectively, and may perform a Fourier transform to transform the plurality of second digital signals CCDS_1 to CCDS_N from a time domain to a frequency domain. For example, the Fourier transformers 181_1 to 181_N may perform a Fast Fourier Transform (FFT). For example, the Fourier transformers 181_1 to 181_N may perform a Fourier transform on each symbol (e.g., orthogonal frequency division multiple (OFDM) symbol) in a cell signal corresponding to a CC. The Fourier transformers 181_1 to 181_N output Fourier-transformed digital signals FDS_1 to FDS_N through the Fourier transform.

The power measurement units 182_1 to 182_N may be provided for a plurality of CCs, respectively and measure the signal strength of the digital signals FDS_1 to FDS_N Fourier transformed through the Fourier transformers 181_1 to 181_N. For example, the power measurement units 182_1 to 182_N may measure power values PV_1 to PV_N. The power measurement units 182_1 to 182_N measure power values PV_1 to PV_N of the plurality of Fourier transformed digital signals FDS_1 to FDS_N, respectively and transmit the measured power values PV_1 to PV_N to the AGC controller 183. For example, the power values PV_1 to PV_N may be transmitted to the AGC controller 183 in the form of a received signal strength indicator (RSSI). For example, the RSSI may be a numerical value.

The AGC controller 183 generates the analog gain control signal C_AG and the digital gain control signals C_DG1 to C_DGN based on the power values PV_1 to PV_N measured from the power measurement units 182_1 to 182_N. The AGC controller 183 calculates the total gain of the received signal (i.e., the baseband signal BB), and the analog and digital gains according the total gain, based on the measured power values PV_1 to PV_N. The AGC controller 183 generates the analog gain control signal C_AG for compensating for the calculated analog gain, and generates the digital gain control signals C_DG1 to C_DGN for compensating for the calculated digital gain.

According to an embodiment, the AGC controller 183 may operate to increase at least one of a total gain, an analog gain, and a digital gain when it is determined that the strength of the received signal is low or lower than a first threshold, or operate to reduce at least one of the total gain, the analog gain, and the digital gain when it is determined that the strength of the received signal is high or higher than a second threshold. The second threshold is higher than the first threshold.

In an embodiment, the AGC controller 183 generates the analog gain control signal C_AG based on a cell having the greatest signal strength among a plurality of CCs. For example, the AGC controller 183 may calculate an analog gain based on the CC of the cell having the largest power value among the received power values PV_1 to PV_N.

According to an embodiment, the AGC controller 183 compares the power values PV_1 to PV_N measured from the power measurement units 182_1 to 182_N, that is, the power values PV_1 to PV_N of the received signals to corresponding preset target power values, and calculates the digital gain such that the strength of the received signal is compensated for up to the preset target power values.

The AGC controller 183 transmits the generated analog gain control signal C_AG to the analog gain compensator 120. The analog gain compensator 120 may perform a compensation operation with a common analog gain for the baseband signal BB.

As described above, the AGC controller 183 generates the digital gain control signals C_DG1 to C_DGN for the plurality of CCs. The generated digital gain control signals C_DG1 to C_DGN are transmitted to the plurality of CC filtering circuits 160_1 to 160_N, more specifically, to the plurality of digital gain compensators 163, respectively.

Each digital gain compensator 163 may perform a compensation operation with the same or different digital gain for each CC.

According to the above-described embodiment, the gain controller 180 of the present disclosure may measure the signal strength of the second digital signal for each of the plurality of CCs (e.g., CCDS_1 to CCDS_N), and may perform a compensation operation with appropriate analog and digital gains according to the measured strength. Accordingly, the analog gain compensator and the digital gain compensator may perform signal amplification without saturation of signal strength. Such saturation of signal strength may distort a cell signal having a relatively weak strength, but according to the present disclosure, the signal distortion of a weak cell may be prevented, so that cell performance may be prevented from being degraded.

Hereinafter, an operation of the digital signal processing circuit 100 according to various embodiments of the present disclosure described above will be described with focus on a signal. For convenience, it will be described below that the received signal and the baseband signal BB converted from the received signal include two CCs, but embodiments of the present disclosure are not limited thereto.

Figure 4:
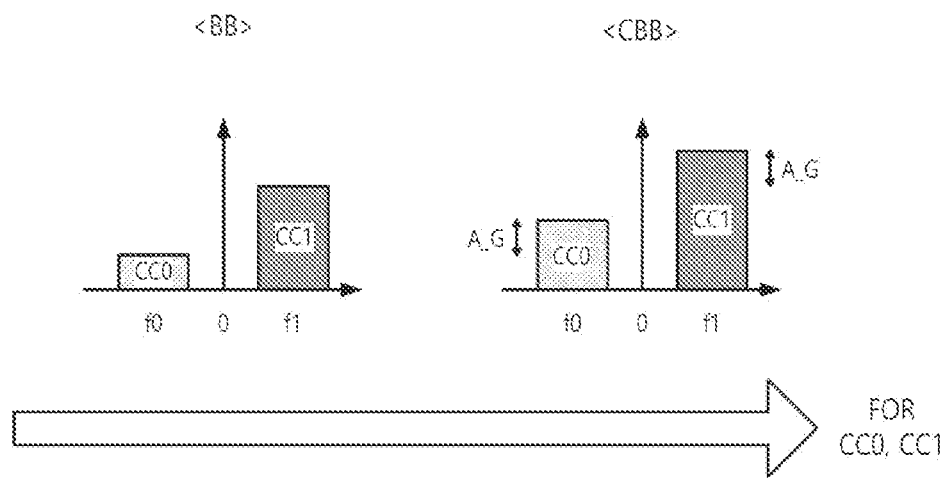
FIG. 4 is a diagram illustrating an analog gain compensation operation according to an embodiment of the present disclosure.

FIG. 4 is a diagram illustrating an analog gain compensation operation according to an embodiment of the present disclosure.

Referring to FIG. 4, the analog gain compensation operation may be performed by the analog gain compensator 120 described above. The baseband signal BB includes two CCs CC0 and CC1. For example, a cell signal transmitted through CC0 has a relatively weak signal strength compared to a cell signal transmitted through CC1. The baseband signal BB is an input to the analog gain compensator 120.

The analog gain compensator 120 compensates the baseband signal BB with a common analog gain A_G according to the analog gain control signal C_AG. As shown, the common analog gain A_G is commonly applied to all CCs included in the baseband signal BB. For example, the common analog gain A_G may be calculated based on a cell signal having a relatively strong signal strength, that is, a signal transmitted through CC1. Through analog gain compensation, the baseband signal BB is output as the compensated baseband signal CBB. For example, the compensation may increase an amplitude of one or more of the CCs by the common analog gain A_G.

The compensated baseband signal CBB is converted into the first digital signal DS through the ADC 140 and then digitally filtered through the plurality of CC filtering circuits 160_1 to 160_N.

Figure 5:
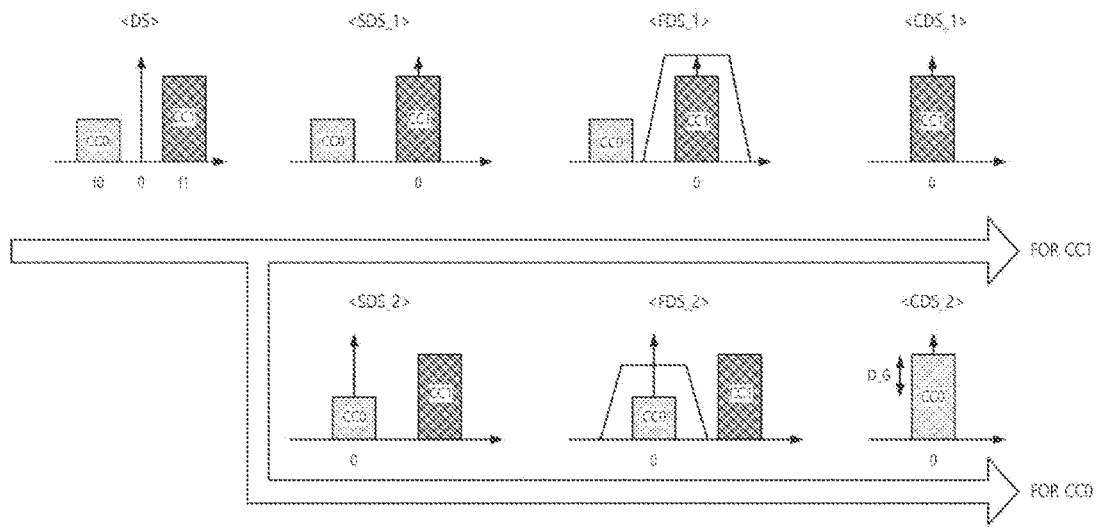
FIG. 5 is a diagram illustrating a digital filtering operation for each CC according to an embodiment of the present disclosure.

FIG. 5 is a diagram illustrating a digital filtering operation for each CC according to an embodiment of the present disclosure.

Referring to FIG. 5, when the first digital signal DS is input to the mixer 161, the mixer 161 shifts one assigned CC to a target frequency. For example, a mixer for processing CC1 shifts CC1 to a target frequency, and a mixer for processing CC0 shifts CC0 to a target frequency. As shown, when the target frequency is 0 (zero), the first digital signal DS for each CC is converted into frequency-shifted digital signals SDS_1 and SDS_2 having a DC component.

The frequency-shifted digital signals SDS_1 and SDS_2 are filtered by the filter 162. For example, a filter for processing CC1 performs filtering to remove the remaining CCs (i.e., CC0) except for a signal component corresponding to CC1, and a filter for processing CC0 performs filtering to remove the remaining CCs (i.e., CC1) except for a signal component corresponding to CC0. Accordingly, the filtered digital signal FDS_1 or FDS_2 has only a signal component corresponding to one CC.

The filtered digital signals FDS_1 and FDS_2 are compensated with an appropriate digital gain D_G through the digital gain compensator 163. The filtered digital signals FDS_1 and FDS_2 may be compensated for with different digital gains D_G for each CC. For example, as shown, CC1 is determined to have sufficient signal strength and thus the digital gain D_G is not compensated, but CC0 is determined to be less than the target power, and the digital gain D_G is compensated. The compensated digital signals CDS_1 and CDS_2 are generated through the digital gain compensator 163. The strengths of the compensated digital signals CDS_1 and CDS_2 may correspond to target power strengths.

Figure 6:
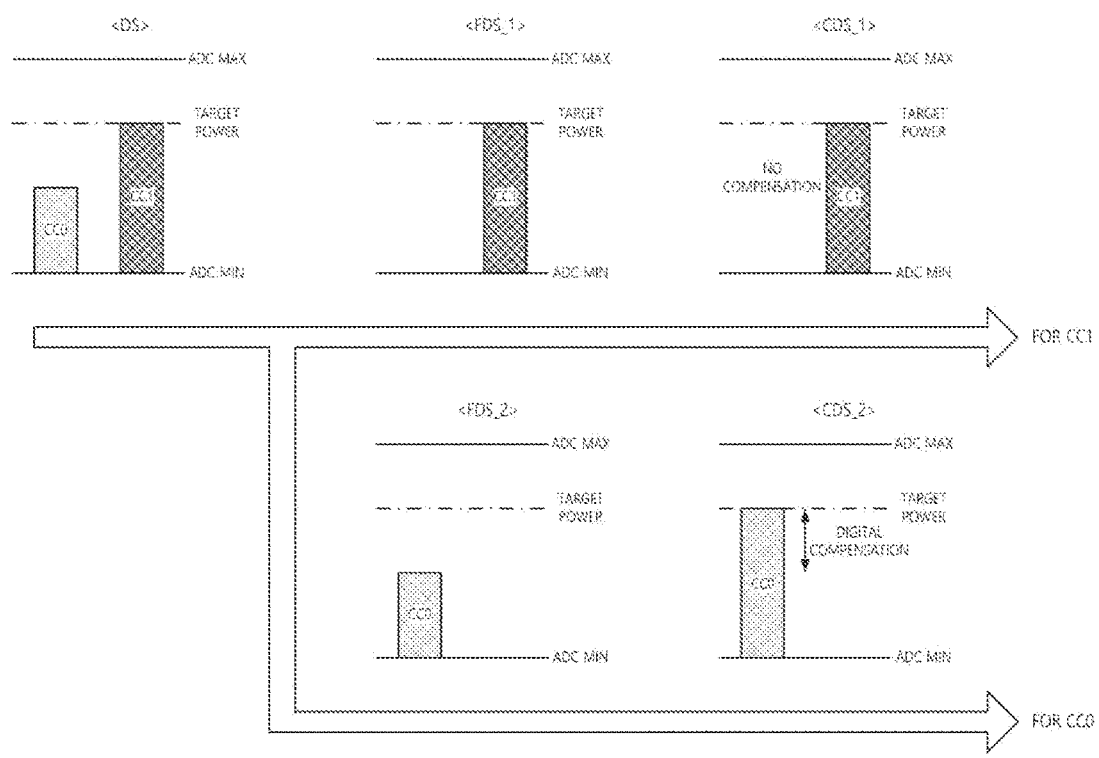
FIG. 6 is a diagram illustrating a digital signal according to an embodiment of the present disclosure in terms of power.

FIG. 6 is a diagram illustrating a digital signal according to an embodiment of the present disclosure in terms of power.

Referring to FIG. 6, the first digital signal DS before digital filtering may exemplarily include signal components corresponding to CC0 and CC1, where CC1 reaches the target power, but the signal strength of CC0 does not reach the target power. Each CC may be within an ADC range defined by the maximum value ADC MAX and the minimum value ADC MIN.

The first digital signal DS is converted into filtered digital signals FDS_1 and FDS_2 through the mixer 161 and the filter 162. In detail, the first filtered digital signal FDS_1 corresponding to CC1 and the second filtered digital signal FDS_2 corresponding to CC0 are separated from each other. They are still not in a state where each gain is adjusted.

The digital gains of the filtered digital signals FDS_1 and FDS_2 are compensated through the digital gain compensator 163. Because the first filtered digital signal FDS_1 already satisfies the target power, its digital gain is not compensated, whereas the digital gain of the second filtered digital signal FDS_2 is compensated to satisfy the target power. In this case, because the digital gain compensations are performed after the signal is separated for each CC, the digital gain compensations may be performed the same or differently. When a digital gain is commonly compensated for all CCs without separation, CC1 may exceed the maximum value of the ADC range after the digital gain is compensated. However, because the digital gain is compensated after the digital signal is separated for each CC according to the present disclosure, saturation of the compensated digital signals CDS_1 and CDS_2 may be prevented.

Figure 7:
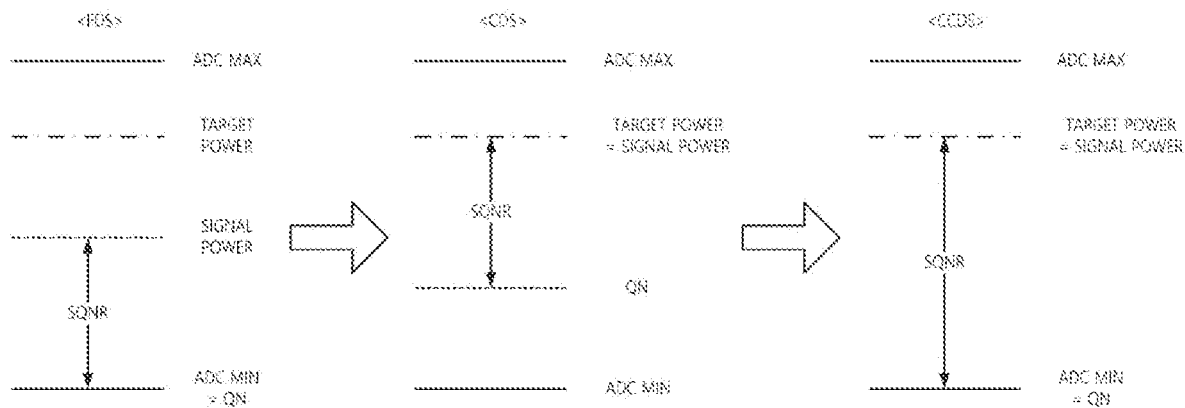
FIG. 7 is a diagram illustrating a digital signal according to an embodiment of the present disclosure in terms of SQNR.

FIG. 7 is a diagram illustrating a digital signal according to an embodiment of the present disclosure in terms of SQNR.

Referring to FIG. 7, it is assumed that an arbitrary filtered digital signal FDS has a signal power less than a target power and quantization noise is equal to the minimum value. The SQNR of the arbitrary filtered digital signal FDS may be defined as the difference between the signal power and a quantization noise level QN.

The quantization noise level of an arbitrary filtered digital signal may be digital gain compensated to have a target power through the digital gain compensator 163. The signal power of the arbitrary compensated digital signal CDS is finally set equal to the target power. In addition, the level QN of quantization noise also increases according to the compensation of the digital gain. In this case, the ratio between signal strength and quantization noise is maintained.

Thereafter, the compensated digital signal CDS is converted into a second digital signal CCDS, which is a digital signal for each CC, through decimation. In this case, the signal strength of the arbitrary compensated digital signal CDS is sufficiently increased as the digital gain is compensated. The quantization noise is affected by the strength of a digital signal. When decimation is performed in a state where the signal strength is weak because the digital gain is not compensated for, there is little change in quantization noise. However, in the present disclosure, because the signal strength of an arbitrary compensated digital signal CDS is sufficiently large as shown, when decimation is performed, the level of quantization noise of the digital signal may fluctuate (decrease) as shown. Accordingly, the SQNR of the second digital signal CCDS may be increased, thereby improving performance of the receiver.

Figure 8:
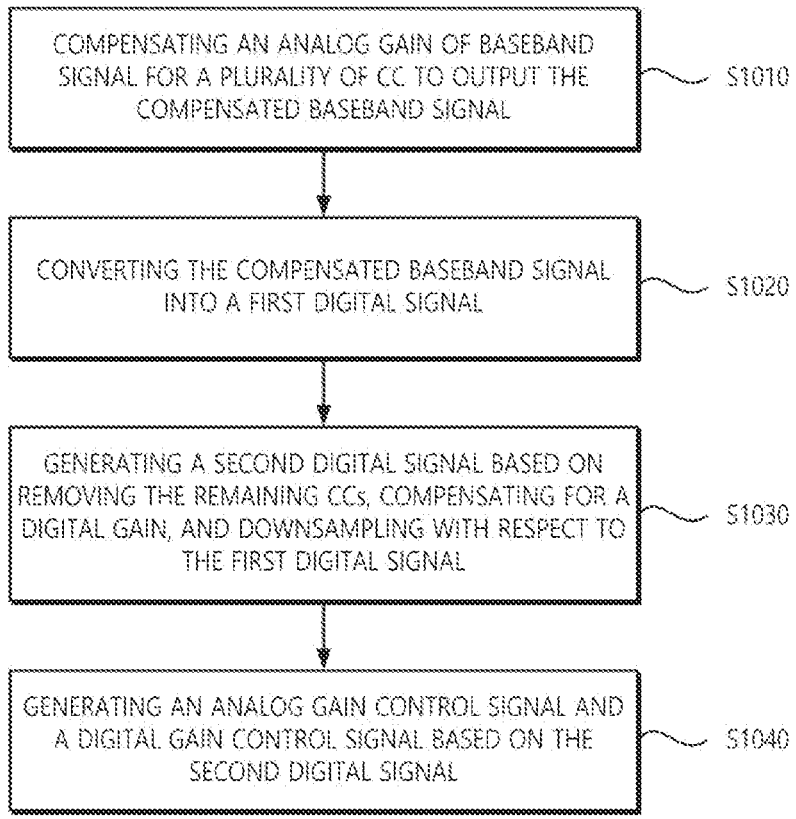
FIG. 8 is a flowchart illustrating a method of operating a digital signal processing circuit according to an embodiment of the present disclosure.

FIG. 8 is a flowchart illustrating a method of operating a digital signal processing circuit according to an embodiment of the present disclosure.

Referring to FIG. 8, according to an embodiment, in operation S1010, the digital signal processing circuit 100 compensates for the analog gain of the baseband signal BB for a plurality of CCs to output a compensated baseband signal CBB. The analog gain may be commonly compensated for the plurality of CCs.

In operation S1020, the digital signal processing circuit 100 converts the compensated baseband signal CBB into a first digital signal DS. Operation S1020 is an ADC operation.

In operation S1030, the digital signal processing circuit 100 removes the remaining CCs except for one CC among the plurality of CCs with respect to the first digital signal DS converted through operation S1020, compensates for the digital gain, and sequentially performs down-sampling to generate a second digital signal CCDS filtered for each of the plurality of CCs. The operation S1030 is a digital filtering operation for each CC.

In operation S1040, the digital signal processing circuit 100 generates the analog gain control signal C_AG for controlling the analog gain based on the second digital signal CCDS generated through operation S1030, and generates the digital gain control signal C_DG for controlling the digital gain. In an embodiment, the digital signal processing circuit 100 Fourier-transforms the second digital signal CCDS, measures the power values PV_1 to PV_N of the received signal from the Fourier transformed digital signal, and calculates the analog gain and digital gain according to the measured power values PV_1 to PV_N.

The generated analog gain control signal C_AG is a control signal commonly applied to all CCs, but the digital gain control signal C_DG is a control signal applied to each CC. The digital signal processing circuit 100 may perform an operation of generating the digital gain control signal C_DG for each CC.

Hereinafter, the operation 1030, which is a filtering operation for each CC, will be described in detail.

Figure 9:
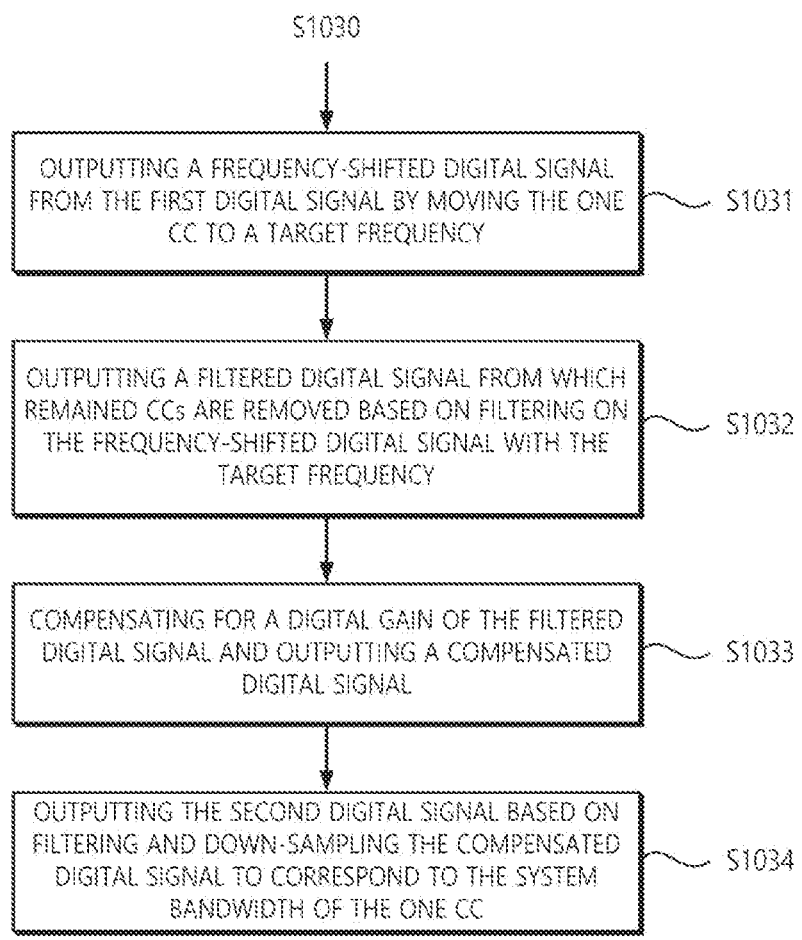
FIG. 9 is a flowchart illustrating a method of operating a digital filter according to an embodiment of the present disclosure.

FIG. 9 is a flowchart illustrating a method of operating a digital filter according to an embodiment of the present disclosure. The method of operating the digital filter 160 according to FIG. 9 may be performed for each of the plurality of CCs.

Referring to FIG. 9, according to an embodiment, in operation S1031, the digital filter 160 shifts (or moves) one of the plurality of CCs from the first digital signal DS converted from the baseband signal BB to a target frequency, thereby outputting the frequency-shifted digital signal SDS. The operation S1031 may be performed for each CC included in the plurality of CCs. That is, each frequency-shifted digital signal SDS may be one of the plurality of CCs shifted to a target frequency. Operation S1031 is performed through the LO frequency of the mixer 161, and the LO frequency may correspond to a difference between the frequency of one CC and the target frequency. Accordingly, all CCs included in each of the frequency-shifted digital signals SDS are shifted by the LO frequency.

In operation S1032, the digital filter 160 outputs the filtered digital signal FDS obtained by removing the remaining CCs from the frequency-shifted digital signal SDS except for one CC by filtering the frequency-shifted digital signal SDS with the target frequency through operation S1031. Similarly, operation S1032 may be performed for each CC included in the plurality of CCs. Filtering may be performed with an appropriate cut-off frequency for filtering one CC.

In operation S1033, the digital filter 160 compensates for the digital gain of the digital signal FDS filtered through operation S1032 to output the compensated digital signal CDS. Similarly, the operation S1033 may be performed for each CC included in the plurality of CCs. The digital gain may be set identically or differently for each CC. Each of the compensated digital signals CDS may have a target power through digital gain compensation.

In operation S1034, the digital filter 160 outputs a second digital signal CCDS through decimation of filtering and down-sampling the compensated digital signal CDS to correspond to the system bandwidth of one CC. In an embodiment, the second digital signal CCDS has a sampling rate lower than the Nyquist frequency through decimation. In addition, quantization noise of a signal corresponding to a cell signal having a relatively weak strength among the second digital signals CCDS may be reduced through decimation, and thus SQNR performance may be increased.

Hereinafter, operation S1040, which is a digital gain control operation of the digital gain controller 180, will be described in detail.

Figure 10:
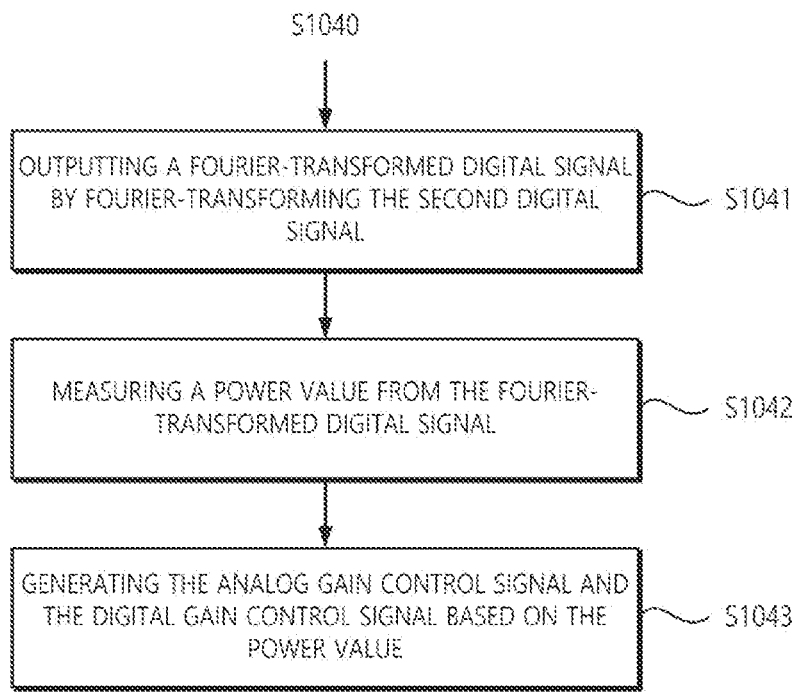
FIG. 10 is a flowchart illustrating a method of operating a digital gain adjuster according to an embodiment of the present disclosure.

FIG. 10 is a flowchart illustrating a method of operating a digital gain adjuster according to an embodiment of the present disclosure.

Referring to FIG. 10, according to an embodiment, in operation S1041, the digital gain controller 180 Fourier-transforms the second digital signal CCDS to output a Fourier transformed digital signal. The operation S1041 is performed for each second digital signal generated for each of the plurality of CCs.

The digital gain controller 180 measures the signal strength, that is, the power values PV_1 to PV_N from the Fourier-transformed digital signal in operation S1042. Similarly, operation S1042 is performed for each Fourier-transformed digital signal generated for each of a plurality of CCs.

In operation S1043, the digital gain controller 180 generates the analog gain control signal C_AG and the digital gain control signal C_DG based on the power values PV_1 to PV_N calculated through the operation S1042. For example, the digital gain controller 180 may compare the calculated power values PV_1 to PV_N with corresponding target power values, and calculate the analog gain or digital gain according to the comparison result.

Hereinafter, an example of applying the digital signal processing circuit 100 according to the above-described embodiments will be described. Detailed descriptions of overlapping parts with those described above will be omitted.

Figure 11:
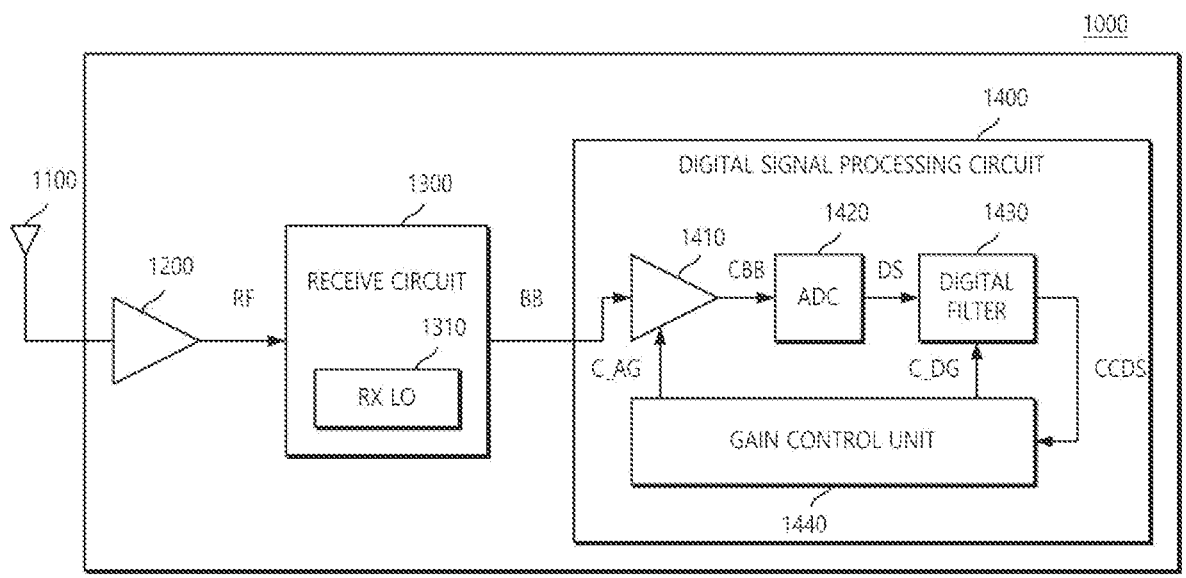
FIG. 11 is a block diagram illustrating a receiver according to an embodiment of the present disclosure.

FIG. 11 is a block diagram illustrating a receiver according to an embodiment of the present disclosure.

Referring to FIG. 11, a receiver 1000 according to an embodiment may be connected to a wireless communication system and receive a signal through an antenna 1100. In this case, the wireless communication system may be a wireless communication system using a cellular network such as a 5-th generation wireless (5G) system, a long term evolution (LTE) system, an LTE-advanced system, a code division multiple access (CDMA) system, a global system for mobile communications (GSM) system, and the like, a wireless local area network (WLAN) system, or any other wireless communication system, or may include various other wireless communication systems.

For example, the receiver 1000 may receive a signal transmitted in various multiple access schemes, such as code division multiple access (CDMA), frequency division multiple access (FDMA), time division multiple access (TDMA), orthogonal frequency division multiple access (OFDMA), single carrier frequency division multiple access (SC-FDMA), OFDM-FDMA, OFDM-TDMA, OFDM-CDMA, and the like, through a wireless communication network.

For example, the receiver 1000 may be a base station (BS) that has a fixed point and communicates with user equipment and/or another base station or may be included in a base station, or may be user equipment (UE) that is fixed or mobile and communicates with other user equipment and/or a base station, or may be included in the user equipment.

The receiver 1000 includes the antenna 1100, a low-noise-amplifier (LNA) 1200, a receiving circuit 1300, and a digital signal processing circuit 1400.

The antenna 1100 receives an RF signal RF transmitted from another wireless communication device and provides the received RF signal RF to the LNA 1200. As described above, the RF signal RF may be transmitted through at least one CC. One or more antennas 1100 may be provided, and each antenna 1100 may receive the RF signal transmitted through the same or different frequency bands.

The LNA 1200 amplifies the RF signal RF received through the antenna 1100 and provides the amplified RF signal RF to the receiving circuit 1300.

The receiving circuit 1300 processes the amplified RF signal RF from the LNA 1200 to generate a baseband signal BB. For example, the receiving circuit 1300 may generate the baseband signal BB by down-converting the RF signal RF from the RF band to the baseband. The receiving circuit 1300 may include an RX LO 1310 that generates an oscillator signal including an LO frequency used for the down conversion. The RX LO 1310 may generate the LO frequency for down-converting the RF signal RF from an RF band to a baseband. The receiving circuit 1300 may include a mixer, a filter, an amplifier, or a phase-locked-loop (PLL) to generate the baseband signal BB.

The digital signal processing circuit 1400 receives the converted baseband signal BB from the receiving circuit 1300 based on the above-described embodiments, compensates for the analog gain through an analog gain adjuster 1410, outputs a compensated baseband signal CBB, converts the compensated baseband signal CBB into the first digital signal DS through an ADC 1420, and digitally filters the first digital signal DS for each CC, thereby generating the second digital signal CCDS. The analog gain adjuster 1410 may be implemented by the analog gain compensator 120. A gain controller 1440 of the digital signal processing circuit 1400 may provide the analog gain control signal C_AG to the analog gain adjuster 1410 and provide a digital gain control signal C_DG to a digital filter 1430 of the digital signal processing circuit 1400. The digital filter 1430 may be implemented by the digital filter 160.

According to an embodiment, the digital signal processing circuit 1400 may compensate for the analog gain of the baseband signal BB for the plurality of CCs through the analog gain adjuster 1410 to output the compensated baseband signal CBB.

According to an embodiment, the digital signal processing circuit 1400 converts the compensated baseband signal CBB into the first digital signal DS.

According to an embodiment, the digital signal processing circuit 1400 generates the second digital signal CCDS through digital filtering of the first digital signal DS. The digital filtering may mean sequentially removing CCs other than one of the plurality of CCs, compensating for the digital gain, and performing down-sampling.

According to an embodiment, the digital signal processing circuit 1400 may generate the analog gain control signal C_AG for controlling the analog gain, and generate the digital gain control signal for controlling the digital gain based on the second digital signal CCDS.

The digital signal processing circuit 1400 digitally filters the converted baseband signal BB through one RX LO 1310 as shown. Because the baseband signal BB is down-converted through one LO frequency, it is first converted in the RF band including all CCs, rather than being separated for each CC. The digital signal processing circuit 1400 commonly performs analog gain compensation for the baseband signal BB including the plurality of CCs, but performs digital gain compensation for each CC. Thus, neither CC may be digitally filtered without being saturated. In addition, because the digital signal processing circuit 1400 performs a decimation operation after the digital gain is compensated for each CC, the SQNR performance may be increased. Accordingly, the receiver 1000 according to the present disclosure may operate with a reduced SQNR without signal saturation even in a structure supporting multiple cells with a single LO.

Specific embodiments have been described above. The present disclosure may include not only the above-described embodiments, but also simple design changes or easily changeable embodiments. In addition, the present disclosure may include techniques that can easily modify and implement the embodiments. Therefore, the scope of the present disclosure should not be limited to the above-described embodiments, but should be defined by the claims described below as well as the claims and equivalents.

What is claimed is:

1. A digital signal processing circuit comprising:
    an analog gain compensator configured to compensate for an analog gain of a baseband signal including a plurality of component carriers (CCs) to output a compensated baseband signal;
    an analog-to-digital converter (ADC) configured to convert the compensated baseband signal into a first digital signal;
    a plurality of filtering circuits configured to generate a plurality of second digital signals from the first digital signal, where each filtering circuit sequentially filters the first digital signal so that a corresponding one of the second digital signals retains one CC among the CCs, compensates for a digital gain, and performs down-sampling; and
    a first control circuit configured to generate an analog gain control signal for controlling the analog gain based on the plurality of second digital signals and a digital gain control signal for controlling the digital gain based on the plurality of second digital signals, wherein the first control circuit comprises:
a plurality of logic circuits connected to each of the plurality of filtering circuits and configured to perform a Fourier transform on a corresponding one of the second digital signals to output a plurality of Fourier transformed digital signals;
a plurality of power measurement circuits configured to measure a power value from each of the plurality of Fourier-transformed digital signals to generate a plurality of power values; and
a second control circuit configured to generate the analog gain control signal and the digital gain control signal based on the plurality of power values.

2. The digital signal processing circuit of claim 1, wherein each of the plurality of filtering circuits comprises:
a mixer configured to output a frequency-shifted digital signal from the first digital signal by shifting the one CC to a target frequency;
a filter configured to output a filtered digital signal from which CCs other than the one CC are removed from the frequency-shifted digital signal by filtering the frequency-shifted digital signal based on the target frequency;
a digital gain compensator configured to output a compensated digital signal by compensating for a digital gain of the filtered digital signal based on the digital gain control signal; and
a decimation filter configured to output a corresponding one of the second digital signals by filtering and down-sampling the compensated digital signal corresponding to a system bandwidth of the one CC.

3. The digital signal processing circuit of claim 2, wherein the target frequency includes a direct current (DC) frequency.

4. The digital signal processing circuit of claim 2, wherein the mixer is configured to shift the one CC to the target frequency using a frequency corresponding to the one CC generated by a local oscillator (LO).

5. The digital signal processing circuit of claim 1, wherein the one CC is different for each of the plurality of filtering circuits.

6. The digital signal processing circuit of claim 5, wherein the digital gain control signal is generated for each of the plurality of filtering circuits.

7. The digital signal processing circuit of claim 5, wherein the digital gain control signal controls each of the plurality of filtering circuits to allow a digital gain of the one CC to be compensated with a target digital gain.

8. The digital signal processing circuit of claim 2, wherein the filter is a low-pass-filter (LPF).

9. The digital signal processing circuit of claim 2, wherein a signal-to-quantization noise ratio (SQNR) of at least one of the second digital signals is greater than a SQNR of the compensated digital signal.

10. The digital signal processing circuit of claim 1, wherein the second digital signals are generated to satisfy a target power for each of the plurality of CCs.

11. A digital filter comprising:
a plurality of filtering circuits each configured to process one component carrier (CC) of a plurality of CCs, wherein each of the plurality of filtering circuits comprises:
a mixer configured to output a frequency-shifted digital signal by shifting one CC among the plurality of CCs from a first digital signal converted from a baseband signal to a target frequency;
a filter configured to output a filtered digital signal from which CCs other than the one CC are removed from the frequency-shifted digital signal by filtering the frequency-shifted digital signal based on the target frequency;
a digital gain compensator configured to output a compensated digital signal by compensating for a digital gain of the filtered digital signal; and
a decimation filter configured to output a second digital signal by filtering and down-sampling the compensated digital signal corresponding to a system bandwidth of the one CC;
a plurality of logic circuits connected to each of the plurality of filtering circuits and configured to perform a Fourier transform on a corresponding one of the second digital signals to output a plurality of Fourier transformed digital signals;
a plurality of power measurement circuits configured to measure a power value from each of the plurality of Fourier-transformed digital signals to generate a plurality of power values; and
a control circuit configured to generate a digital gain control signal for controlling the digital gain based on the plurality of power values.

12. The digital filter of claim 11, wherein the one CC is different for each of the plurality of filtering circuits.

13. The digital filter of claim 11, wherein the target frequency includes a direct current (DC) frequency.

14. The digital filter of claim 11, wherein the mixer is configured to shift the one CC to the target frequency using a frequency corresponding to the one CC generated by a local oscillator (LO).

15. The digital filter of claim 11, wherein the digital gain compensator is configured to operate based on a digital gain control signal generated for each of the plurality of filtering circuits.

16. The digital filter of claim 11, wherein a signal-to-quantization noise ratio (SQNR) of the second digital signal is greater than a SQNR of the compensated digital signal.

17. The digital filter of claim 11, wherein the second digital signal is generated to satisfy a target power for each of the plurality of CCs.

18. A receiver comprising:
a low-noise amplifier (LNA) configured to amplify a radio frequency (RF) signal including a plurality of component carriers (CCs) received from an antenna;
a receiving circuit configured to process the RF signal using an oscillator signal generated by a single local oscillator (LO) to output a baseband signal; and
a digital signal processing circuit configured to digitally process the baseband signal,
wherein the digital signal processing circuit comprises:
an analog gain compensator configured to compensate for an analog gain of a baseband signal to output a compensated baseband signal;
an analog-to-digital converter (ADC) configured to convert the compensated baseband signal into a first digital signal;
a plurality of filtering circuits configured to generate a plurality of second digital signals from the first digital signal, where each filtering circuit sequentially filters the first digital signal so that a corresponding one of the second digital signals retains one CC among the CCs, compensates for a digital gain, and performs down-sampling; and a first control circuit configured to generate an analog gain control signal for controlling the analog gain based on the plurality of second digital signals and a digital gain control signal for controlling the digital gain based on the plurality of second digital signals, wherein the first control circuit comprises:
a plurality of logic circuits connected to each of the plurality of filtering circuits and configured to perform a Fourier transform on a corresponding one of the second digital signals to output a plurality of Fourier transformed digital signals;
a plurality of power measurement circuits configured to measure a power value from each of the plurality of Fourier-transformed digital signals to generate a plurality of power values; and
a second control circuit configured to generate the analog gain control signal and the digital gain control signal based on the plurality of power values.

19. The receiver of claim 18, wherein the plurality of filtering circuits each are configured to process one CC of the plurality of CCs.

* * * * *